United States Patent
Jefferson

[19]

[11] Patent Number: 6,163,195
[45] Date of Patent: Dec. 19, 2000

[54] TEMPERATURE COMPENSATED DELAY CHAIN

[75] Inventor: David Jefferson, Morgan Hill, Calif.

[73] Assignee: Altera Corporation, San Jose, Calif.

[21] Appl. No.: 09/318,376

[22] Filed: May 26, 1999

Related U.S. Application Data

[60] Provisional application No. 60/086,634, May 26, 1998.

[51] Int. Cl.[7] ................................................. H03H 11/26
[52] U.S. Cl. ........................ 327/262; 327/261; 327/276; 327/278
[58] Field of Search .................................... 327/261, 262, 327/276, 278, 281, 534–537; 331/57, 109, 157, 158

[56] References Cited

U.S. PATENT DOCUMENTS

| | | | |
|---|---|---|---|
| 5,081,380 | 1/1992 | Chen | 327/281 |
| 5,227,675 | 7/1993 | Taguchi | 327/535 |
| 5,731,727 | 3/1998 | Iwamoto et al. | 327/262 |
| 5,748,542 | 5/1998 | Zheng et al. | 365/194 |
| 6,005,434 | 12/1999 | Tsukikawa et al. | 327/537 |
| 6,034,557 | 3/2000 | Schultz et al. | 327/276 |

OTHER PUBLICATIONS

LSI Logic, LCB500K Cell–Based ASIC Products, pp. ii–xix, 2–87 –2–103 (Dec. 1996).
LSI Logic, LCB300K Cell–Based 5 Volt ASIC Products Databook, pp. ii–iii, v–xiii, 2–105 –2–130 (Oct. 1994).

*Primary Examiner*—Son Mai
*Attorney, Agent, or Firm*—Morrison & Foerster LLP

[57] ABSTRACT

A delay circuit is provided for delaying signals. The delay circuit includes: at least one inverter having a time delay; at least one current source coupled to the at least one inverter, the at least one current source providing charging current to the at least one inverter; and a voltage biasing circuit coupled to the at least one current source, the voltage biasing circuit providing a biasing voltage to the at least one current source such that the at least one current source varies the charging current so as to maintain the time delay of the at least one inverter substantially constant.

31 Claims, 4 Drawing Sheets

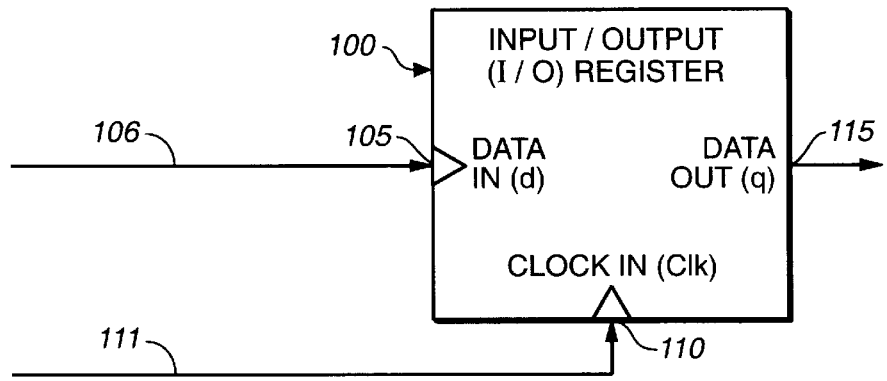
FIG._1
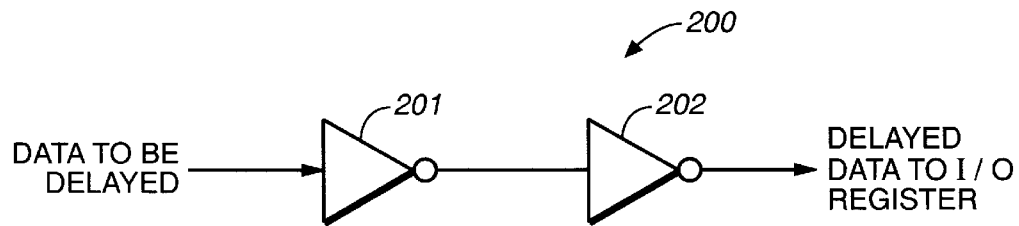
FIG._2
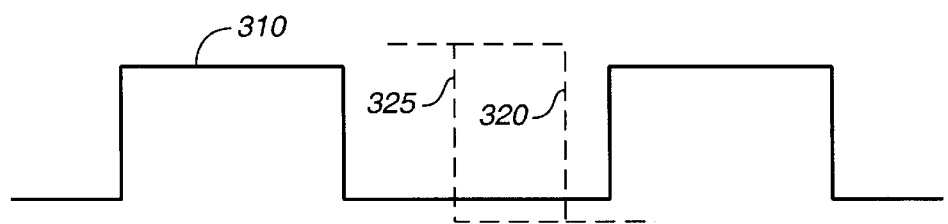
FIG._3

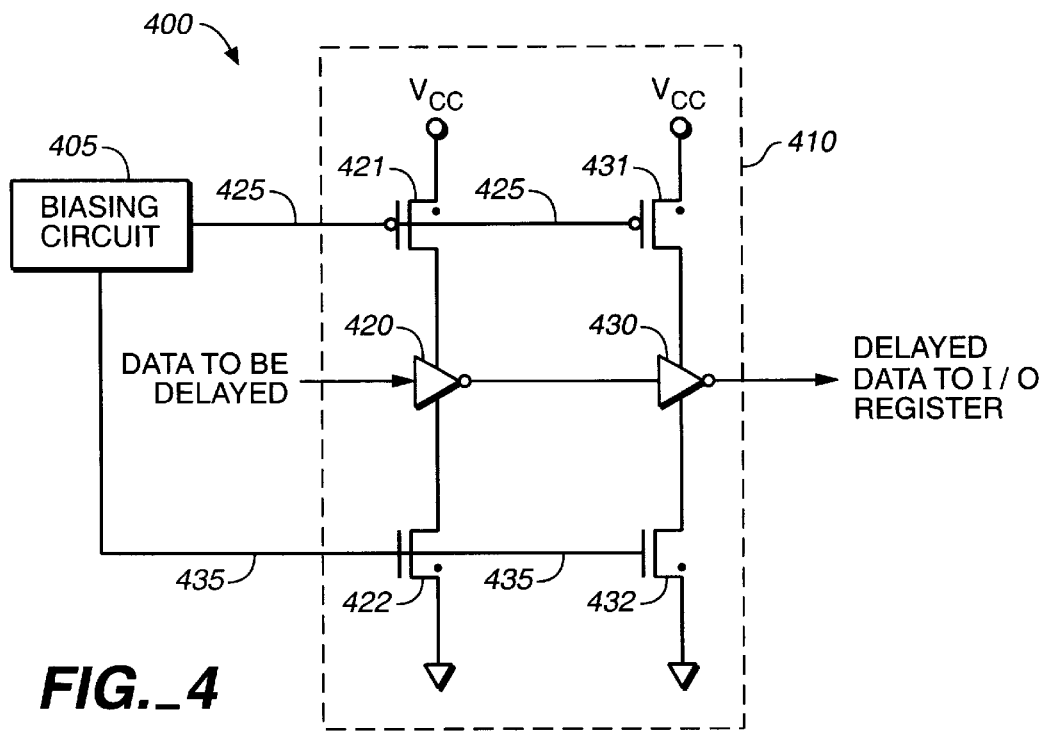
FIG._4
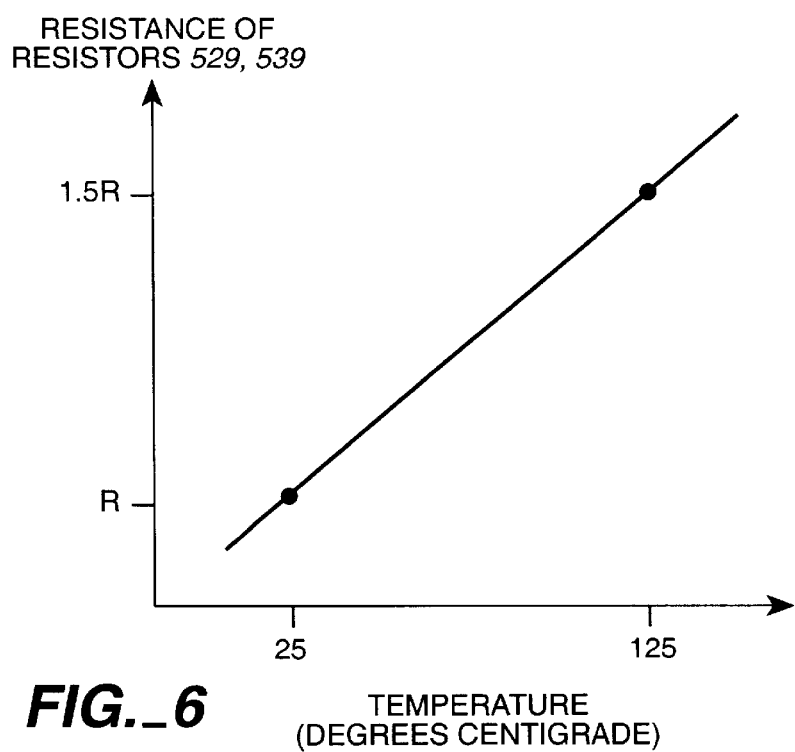
FIG._6

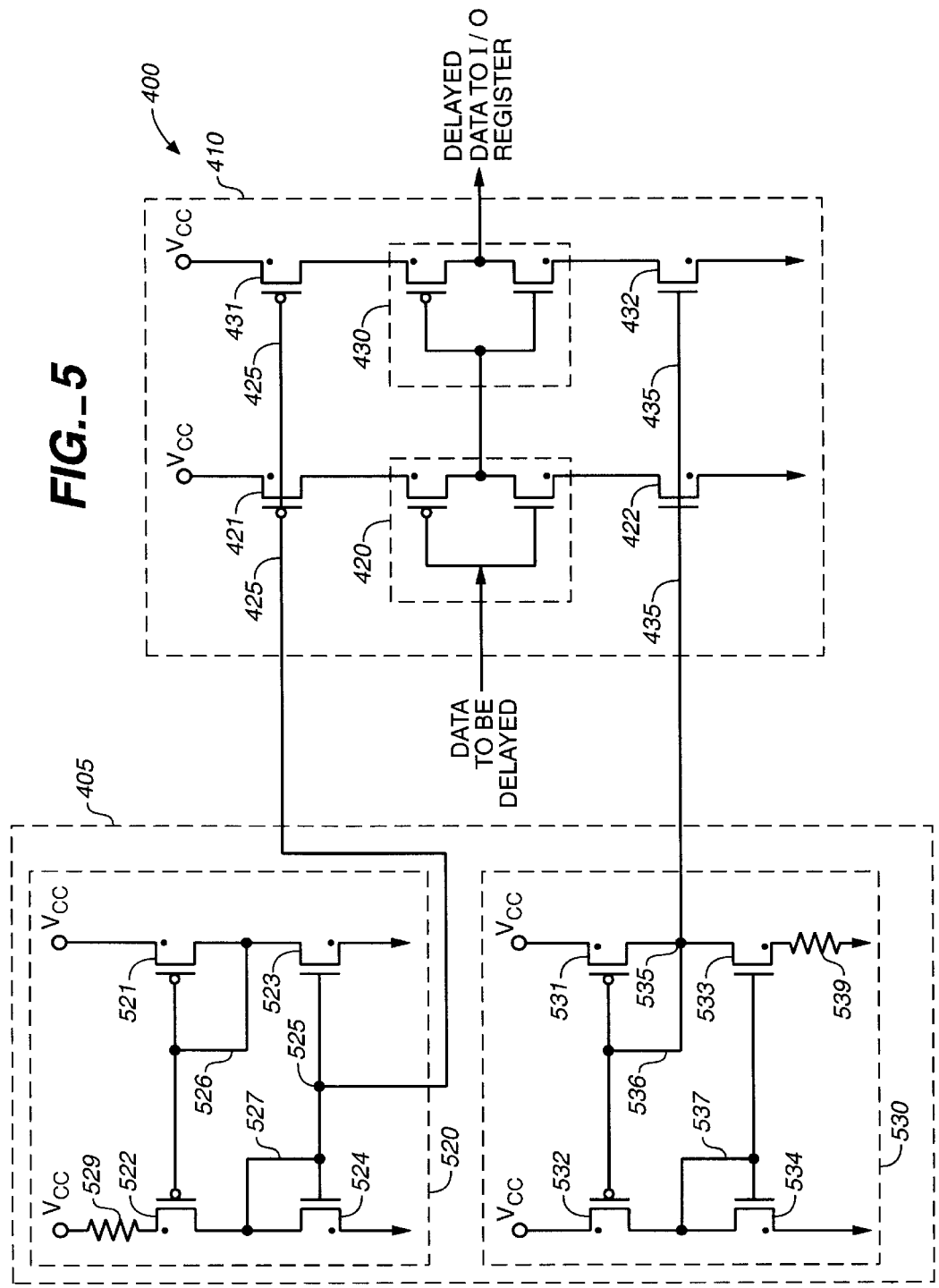
FIG._5

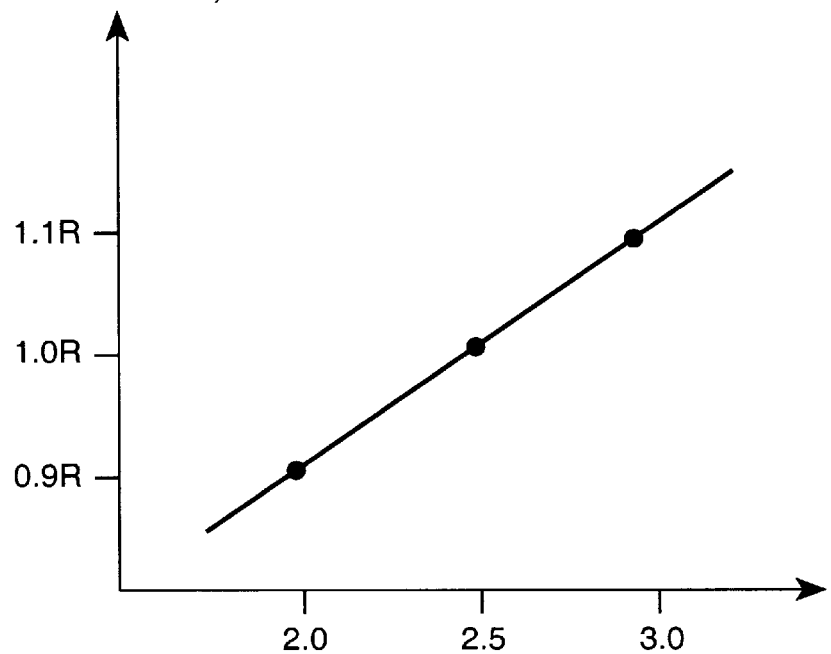
FIG._7
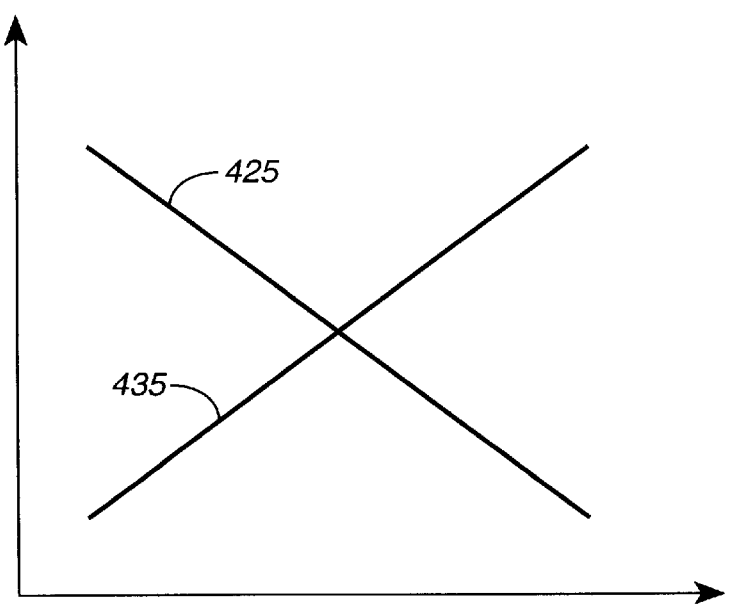
FIG._8

TEMPERATURE COMPENSATED DELAY CHAIN

CROSS-REFERENCE TO RELATED APPLICATIONS

This application claims the benefit of U.S. Provisional Application Serial No. 60/086,634, filed May 26, 1998, and titled "Temperature, Process and Voltage Compensated Delay Chain".

BACKGROUND OF THE INVENTION

1. Field of the Invention

This invention relates generally to delay cells and, in particular, to delay cells with substantially constant delays over varying temperatures and voltages.

2. Description of the Related Art

A typical integrated circuit ("IC") includes registers or latches, which act as memory elements. FIG. 1 is a block diagram of an input/output (I/O) register. In FIG. 1, I/O register 100 has a data input port 105, a clock input port 110, and a data output port 115.

The data signal input to the data input port 105 and the clock signal input to the clock input port 110 are typically required to meet certain relative timing specifications. For example, these signals must meet set-up time ($T_S$) and hold time ($T_H$) specifications for the I/O register 100. The $T_S$ specification requires that the data signal be present at the data signal input port 105 at least by a time $T_S$ prior to the clock transition. The $T_H$ specification requires that the data signal be held for a time $T_H$ after the clock transition. A positive $T_H$ requires that the data signal be held for some time $T_H$ after the clock transition and increases the time needed for storing data into the I/O register. A $T_H$ of zero would require holding the data until the clock transition. A negative $T_H$ would require holding the data signal until a time $T_H$ before the clock transition. A $T_H$ of zero or less (i.e., a negative $T_H$) would not increase the time needed to store data into the I/O register. As a result, it is preferable to have a negative $T_H$ or at the least a zero $T_H$.

In a positive edge triggered system, the clock transition with respect to which $T_S$ and $T_H$ are measured is a positive transition, i.e., a transition from a low value to a high value. Conversely, in a negative edge triggered system, the clock transition with respect to which $T_S$ and $T_H$ are measured is a negative transition, i.e., a transition from a high value to a low value.

The data and clock signals input into the data input port 105 and the clock input port 110, respectively, travel on a data path 106 and a clock path 111, respectively. Generally, the data path is the distance between two I/O registers, which is relatively short. On the other hand, the clock path tends to be relatively long as it can span from one end of the IC to the other. As a result, the delay on clock path 111 tends to be longer than the delay on the data path 106.

As noted above, in order to meet the preferred $T_H$ specification of zero or less, the data signal must be held for a time of zero or more before the clock transition. The data signal corresponding to the next clock period must be received after the end of the hold period for the current data signal in order to prevent prematurely overriding the current data signal. Accordingly, the data signal is delayed by an amount sufficient to account for the difference in delay between the clock path 111 and data path 106 and to meet the above-mentioned condition (i.e., receiving the data signal corresponding to the next clock period after the end of the hold period for the current data signal).

FIG. 2 is a diagram of a delay chain used for delaying the data signal. In FIG. 2, delay chain 200 includes inverters 201 and 202. Inverters 201 and 202 cause the data signal to be delayed sufficiently so as to meet the $T_H$ specification. Inverters 201 and 202 are commonly complementary metal oxide semiconductor (CMOS) inverters. Accordingly, they comprise transistors. Generally, the speed of a transistor is affected by the drive voltage and the temperature of the transistor. The speed of a transistor also depends on the process by which a transistor was made. The speed of the transistor increases with an increase in the drive voltage and decreases with a decrease in the drive voltage of the transistor. Conversely, the speed of the transistor decreases with an increase in the temperature and increases with a decrease in the temperature of the transistor. Finally, based on a number of factors in the manufacturing process, the speed of the transistor varies within a range specified by the manufacturer.

As the speed of the transistors in inverters 201 and 202 varies based on the aforementioned factors, the speed of inverters 201 and 202 also depends on the aforementioned factors. Consequently, the delay caused by inverters 201 and 202 is not constant, but varies based on the aforementioned factors. In order to assure that the delay chain 200 causes the necessary delay for meeting the $T_H$ specification over the range of voltage, temperature, and process conditions that the delay chain may operate under, the delay of delay chain 200 is set such that even under fast conditions (i.e., high voltage, low temperature, and fast process), the data signal corresponding to the next clock period will arrive after the hold period for the current data signal. When the process is slower, the voltage is lower, and/or the temperature is higher, then the delay caused by delay chain 200 is increased. In other words, the hold time condition is improved as the data signal corresponding to the next clock cycle is more likely to arrive after the hold period for the current data signal. However, the set-up time condition is worsened as the set-up time is increased.

FIG. 3 is a diagram of the timing relationship between the clock and data signals. In FIG. 3, wave 310 represents the clock signal, whereas waves 320 and 325 represent the data signal with different delays. Wave 320 represents the data signal with a greater delay in order to meet the $T_H$ specification for high voltage and low temperature conditions. Wave 325 represents the data signal with a smaller delay needed to meet the $T_H$ specification for low voltage and high temperature conditions. The data delay is set long enough to correspond to wave 325 even under the condition of high voltage and low temperature.

Setting the delay of delay chain 200 long enough to meet the $T_H$ specification even under high voltage and low temperature causes the data signal to be slower than it needs to be under all conditions. For example when the process is slow, the voltage is low and temperature is high, the delay of the delay chain 200 is increased. This causes the set-up time to increase. The increase in set-up time may create problems when the device operates at a high frequency. As the frequency of the device is increased, the set-up time constitutes a larger portion of the cycle of the device. This causes the overall speed of the device to slow down. The overall speed of the device is the sum of the set-up time, the clock to output time, and the hold time (if the hold time is positive, i.e., if the data must be held for at time $T_H$ after the clock transition). When the hold time is zero or negative, then the overall speed of the device is the sum of the set-up time and the clock to output time. Accordingly, setting a long delay time for delay chain 200 causes the overall speed of the device to slow.

As a result, there has been a need for delay chains that provide the necessary delay for the data signal while avoiding the above-mentioned shortcomings of the earlier systems. The present invention meets this need.

SUMMARY OF THE INVENTION

The present invention encompasses a delay circuit for delaying a signal. The delay circuit comprises: at least one inverter having a time delay; at least one current source coupled to said at least one inverter, said at least one current source providing charging current to said at least one inverter; and a voltage biasing circuit coupled to said at least one current source, said voltage biasing circuit providing a biasing voltage to said at least one current source such that said at least one current source varies the charging current so as to maintain the time delay of said at least one inverter substantially constant.

In a presently preferred embodiment of the invention, the delay circuit comprises: a first CMOS inverter having an input port and an output port; a first p-channel transistor coupled to said first CMOS inverter and a drive voltage supply; a first n-channel transistor coupled to said first CMOS inverter and ground potential; a second CMOS inverter having a second CMOS inverter input port and a second CMOS inverter output port, wherein the first CMOS inverter output port is coupled to the second CMOS inverter input port; a second p-channel transistor coupled to said second CMOS inverter and the drive voltage supply; and a second n-channel transistor coupled to said second CMOS inverter and ground potential.

In one embodiment, the biasing circuit comprises a resistor having a resistance that is temperature dependent and a current mirror coupled to said resistor.

The present invention is explained in more detail below with reference to the drawings.

BRIEF DESCRIPTION OF THE DRAWINGS

FIG. 1 is a block diagram of an input/output (I/O) register.

FIG. 2 is a diagram of a delay chain used for delaying the data signal.

FIG. 3 is a diagram of the timing relationship between the clock and data signals.

FIG. 4 is a diagram of the delay circuit of the presently preferred embodiment of the invention.

FIG. 5 is a detailed circuit diagram of the delay circuit of the presently preferred embodiment of the invention.

FIG. 6 is a graph of the resistance of resistors 529 and 539 as a function of temperature.

FIG. 7 is a graph of the resistance of resistors 529 and 539 as a function of the internal supply voltage $V_{CC}$.

FIG. 8 is a graph of the voltages 425 and 435 as a function of temperature.

DETAILED DESCRIPTION OF THE PREFERRED EMBODIMENT

The present invention comprises a delay cell whose delay remains substantially constant despite variations in temperature and voltage. The following description is presented to enable any person skilled in the art to make and use the invention, and is provided in the context of a particular application and its requirements. Various modifications to the preferred embodiment will be readily apparent to those skilled in the art, and the generic principles defined herein may be applied to other embodiments and applications without departing from the spirit and scope of the invention. Thus, the present invention is not intended to be limited to the embodiment shown, but is to be accorded the widest scope consistent with the principles and features disclosed herein.

FIG. 4 is a diagram of the delay circuit of the presently preferred embodiment of the invention. In FIG. 4, delay circuit 400 comprises biasing circuit 405 and delay cell 410. Delay cell includes inverters 420 and 430, which in a presently preferred embodiment are complementary metal oxide semiconductor (CMOS) inverters. Data signals are input to the input of inverter 420. The output of inverter 420 is input into inverter 430. The output of inverter 430 is provided to the data input port of the register, such as an I/O register, to which the delay circuit 400 is coupled.

A biasing transistor 421 is coupled between inverter 420 and the internal voltage supply $V_{CC}$. Moreover, a biasing transistor 422 is coupled between inverter 420 and ground potential. Similarly, a biasing transistor 431 is coupled between inverter 430 and the internal voltage supply $V_{CC}$. A biasing transistor 432 is also coupled between inverter 430 and ground potential. In a presently preferred embodiment, biasing transistors 421 and 431 are p-channel (PMOS) transistors, whereas biasing transistors 422 and 432 are n-channel (NMOS) transistors.

The biasing circuit 405 is coupled to the gates of biasing transistors 421, 422, 431, and 432. The biasing circuit 405 outputs biasing voltages 425 and 435 to biasing transistors 421, 422, 431, and 432. The biasing voltage 425 is coupled to the gates of biasing transistors 421 and 431, whereas the biasing voltage 435 is coupled to the gates of biasing transistors 422 and 432.

FIG. 5 is a detailed circuit diagram of the delay circuit of the presently preferred embodiment of the invention. In FIG. 5, biasing circuit 405 comprises biasing circuits 520 and 530.

Biasing circuit 520 comprises resistor 529 and transistors 521, 522, 523, and 524. Transistors 521, 522, 523, and 524 are coupled in a current mirror configuration and constitute a Wilson current source. Transistors 521 and 522 are p-channel (PMOS) transistors and are matched to each other, whereas transistors 523 and 524 are n-channel (NMOS) transistors and are matched to each other. The gate of transistor 521 is coupled to the gate of transistor 522. Similarly, the gate of transistor 523 is coupled to the gate of transistor 524. Transistor 523 is coupled to transistor 521 and ground, whereas transistor 524 is coupled to transistor 522 and ground. Transistor 521 is coupled to the internal supply voltage $V_{CC}$, whereas transistor 522 is coupled to resistor 529, which is in turn coupled to the internal supply voltage $V_{CC}$. Line 526 is coupled to the gate and drain of transistor 521, whereas line 527 is coupled to the gate and drain of transistor 524. Biasing voltage 425 is provided from node 525 (which is coupled to the gates of transistors 523 and 524) to the gates of biasing transistors 421 and 431 in delay cell 410.

Biasing circuit 530 comprises resistor 539 and transistors 531, 532, 533, and 534. Transistors 531, 532, 533, and 534 are coupled in a current mirror configuration and constitute a Wilson current source. Transistors 531 and 532 are p-channel (PMOS) transistors and are matched to each other, whereas transistors 533 and 534 are n-channel (NMOS) transistors and are matched to each other. The gate of transistor 531 is coupled to the gate of transistor 532. Similarly, the gate of transistor 533 is coupled to the gate of transistor 534. Transistor 533 is coupled to transistor 531 and to resistor 539, which is in turn coupled to ground, whereas transistor 534 is coupled to transistor 532 and ground. Transistors 531 and 532 are coupled to the internal supply voltage $V_{CC}$. Line 536 is coupled to the gate and drain of transistor 531, whereas line 537 is coupled to the gate and drain of transistor 534. Biasing voltage 435 is provided from node 535 (which is coupled to the gates of transistors 531 and 532) to the gates of biasing transistors 422 and 432 in delay cell 410.

The resistance of resistors 529 and 539 is temperature and voltage dependent. FIG. 6 is a graph of the resistance of resistors 529 and 539 as a function of temperature. As can be seen in FIG. 6, the resistance of resistors 529 and 539 increases with an increase in the temperature. In FIG. 6, R represents the resistance at 25 degrees centigrade and 2.5 volts. At a temperature of 125 degrees centigrade and 2.5 volts, the resistance is approximately equal to (1.5)(R). Therefore, there is a relatively large variance in the resistance of resistors 529 and 539 due to variations in the temperature. In other words, resistors 529 and 539 have a relatively large temperature coefficient. It is to be noted that integrated resistors, such as resistors 529 and 539, tend to have a relatively large temperature coefficient, which is a desired feature in the presently preferred embodiment of the invention.

FIG. 7 is a graph of the resistance of resistors 529 and 539 as a function of the internal supply voltage $V_{CC}$. As mentioned above, at a voltage of 2.5 volts and temperature of 25 degrees centigrade, the resistance is equal to R. The resistance is decreased to (0.9)(R) as the voltage is decreased to 2 volts while the temperature is maintained at 25 degrees centigrade. Conversely, the resistance is increased to (1.1) (R) as the voltage is increased to 3 volts while the temperature is maintained at 25 degrees centigrade. As can be seen in FIG. 7, the resistance of resistors 529 and 539 increases with an increase in voltage.

However, over a range of 1 volt, the resistance of resistors 529 and 539 varies much less than it does over the range of temperatures from 25 to 125 degrees centigrade. As most IC's now commonly use lower voltages, the voltage variations of most modem day IC's is limited and is often bound within a range of 1 volt. On the other hand, temperature variations may still cover a relatively large range. As a result, under most common circumstances, changes in the resistance of resistors 529 and 539 are predominated by changes in the temperature.

As the temperature of resistors 529 and 539 is increased, the resistance of resistors 529 and 539 is increased. An increase in the resistance of resistor 529 causes a decrease in the voltage at node 525. Conversely, an increase in the resistance of resistor 539 causes an increase in the voltage at node 535. As noted earlier, biasing voltages 425 and 435 are the voltages at nodes 525 and 535, respectively. Accordingly, an increase in the temperature of resistors 529 and 539 causes a decrease in the biasing voltage 425 and an increase in the biasing voltage 435.

As the temperature of resistors 529 and 539 is decreased, the resistance of resistors 529 and 539 is decreased. A decrease in the resistance of resistor 529 causes an increase in the voltage at node 525. Conversely, a decrease in the resistance of resistor 539 causes a decrease in the voltage at node 535. As noted earlier, biasing voltages 425 and 435 are the voltages at nodes 525 and 535, respectively. Accordingly, a decrease in the temperature of resistors 529 and 539 causes an increase in the biasing voltage 425 and a decrease in the biasing voltage 435.

FIG. 8 is a graph of the voltages 425 and 435 as a function of temperature. (It is to be noted that temperature, as used herein, refers to the temperature of the delay circuit 400 and its components, including but not limited to the resistors 529 and 539, as well as inverters 420 and 430.) As can be seen in FIG. 8, as the temperature is increased, the biasing voltage 425 is decreased while the biasing voltage 435 is increased.

As biasing transistors 421 and 431 are PMOS transistors, decreasing the biasing voltage 425 causes biasing transistors 421 and 431 to supply more current to inverters 420 and 430, respectively. The increased current supplied to inverters 420 and 430 causes inverters 420 and 430 to operate faster. As a result, the delay of inverters 420 and 430 is decreased. Conversely, increasing the biasing voltage 425 causes biasing transistors 421 and 431 to supply less current to inverters 420 and 430, respectively. The decreased current supplied to inverters 420 and 430 causes inverters 420 and 430 to operate slower. As a result, the delay of inverters 420 and 430 is increased.

As biasing transistors 422 and 432 are NMOS transistors, decreasing the biasing voltage 435 causes biasing transistors 422 and 432 to supply less current to inverters 420 and 430, respectively. The decreased current supplied to inverters 420 and 430 causes inverters 420 and 430 to operate slower. As a result, the delay of inverters 420 and 430 is increased. Conversely, increasing the biasing voltage 435 causes biasing transistors 422 and 432 to supply more current to inverters 420 and 430, respectively. The increased current supplied to inverters 420 and 430 causes inverters 420 and 430 to operate faster. As a result, the delay of inverters 420 and 430 is decreased.

Accordingly, biasing circuit 405, in conjunction with biasing transistors 421, 422, 431, and 432, tends to increase the speed of inverters 420 and 430 when the temperature is increased and decrease the speed of inverters 420 and 430 when the temperature is decreased. This is intended to counteract the direct effect of changes in temperature on the speed of inverters 420 and 430 such that the speed of inverters 420 and 430 remains substantially constant as the temperature is changed.

Increasing the temperature of a transistor causes the transistor to operate slower whereas decreasing the temperature of a transistor causes the transistor to operate faster. As inverters 420 and 430 comprise transistors, increasing/ decreasing the temperature, causes inverters 420 and 430 to operate slower/faster. Thus, the direct effect of an increase in temperature is to decrease the speed of inverters 420 and 430, whereas the direct effect of a decrease in temperature is to increase the speed of inverters 420 and 430. The direct effect of temperature on the speed of the inverters 420 and 430 and the transistors therein is herein referred to as the temperature effect.

The biasing circuit 405, in conjunction with biasing transistors 421, 422, 431, and 432, causes the inverters 420 and 430 to operate faster/slower as the temperature is increased/decreased. The effect of the biasing circuit 405, in conjunction with biasing transistors 421, 422, 431, and 432, to cause the inverters 420 and 430 to operate faster/slower as the temperature is increased/decreased is herein referred to as the biasing effect. It is intended that, as the temperature is varied, changes in the speed of the inverters 420 and 430 due to the biasing effect substantially cancel changes in the speed of the inverters 420 and 430 due to the temperature effect. In other words, it is intended that the increase/ decrease in the speed of inverters 420 and 430 directly due to changes in the temperature is substantially equal to the decrease/increase in the speed of inverters 420 and 430 due to the effect of the biasing circuit, such that the overall speed and the delay of inverters 420 and 430 remains substantially constant as the temperature is varied. This would allow delay circuit 400 to provide substantially constant delay despite variations in the temperature of delay circuit 400.

As temperature range is generally much larger than the voltage range, the variations in temperature have a greater effect on the resistance of resistors 529 and 539. As a result, variations in temperature have a greater effect than variations in the internal supply voltage $V_{CC}$ on the biasing voltages 425 and 435. It is also to be noted that variations in $V_{CC}$ cause the biasing voltages 425 and 435 to reinforce rather than neutralizes the direct effect of variations in $V_{CC}$ on the speed of inverters 420 and 430. However, as the variations in $V_{CC}$ are generally small, the direct voltage effect on the speed of transistors 420 and 430 is small. Similarly, the effect of variations in $V_{CC}$ on the biasing voltages 425 and 435 are also small. As a result of the predominance of the effect of temperature variations on the speed of inverters 420 and 430, both directly and through the biasing voltages 425 and 435, the delay circuit 400 provides a substantially constant delay even when there are variations in $V_{CC}$ within the range of 1 or less volts.

In FIG. 4, biasing circuit 405 is shown as being coupled to only one delay cell, namely delay cell 410. However, biasing circuit 405 may be coupled to all the delay cells within an IC of which it is a part. Similarly, in FIG. 5, biasing circuits 520 and 530 are shown as being part of the same biasing circuit 405. In another embodiment, biasing circuits 520 and 530 need not be shown as being part of the same biasing circuit 405. Moreover, biasing circuit 520 may supply a biasing voltage to all the PMOS biasing transistors of all the other delay cells that are part of the same IC as delay cell 410. Similarly, biasing circuit 530 may supply a biasing voltage to all the NMOS biasing transistors of all the other delay cells that are part of the same IC as delay cell 410.

In an alternative embodiment, resistors 529 and 539 may have negative temperature coefficients rather than the positive temperature coefficients illustrated in FIG. 6. With a negative temperature coefficient, the resistance would decrease with an increase in temperature and increase with a decrease in temperature. Preferably, the negative temperature coefficient would have a large absolute value. In other words, there would be a relatively large variance in the resistance of resistors 529 and 539 due to variations in the temperature as in the example illustrated in FIG. 6. In the alternative embodiment, where resistors 529 and 539 have negative temperature coefficients, nodes 525 and 535 would provide biasing voltages 435 and 425, respectively. (In other words, node 535 in biasing circuit 530 would provide the biasing voltage 425 for transistors 421 and 431, whereas node 525 in biasing circuit 520 would provide the biasing voltage 435 for transistors 422 and 432.) In such a case, assuming the absolute value of the negative temperature coefficient is approximately equal to the absolute value of the positive temperature coefficient illustrated in FIG. 6, voltages 425 and 435 would vary with temperature as illustrated in FIG. 8. Therefore, in the aforementioned alternative embodiment, the biasing circuit 405 would continue to provide the desired biasing voltages for compensating for the temperature effect on the speed of inverters 420 and 430.

While the present invention has been particularly described with respect to the illustrated embodiments, it will be appreciated that various alterations, modifications and adaptations may be made based on the present disclosure, and are intended to be within the scope of the present invention. While the invention has been described in connection with what are presently considered to be the most practical and preferred embodiments, it is to be understood that the present invention is not limited to the disclosed embodiment but, on the contrary, is intended to cover various modifications and equivalent arrangements included within the scope of the appended claims.

What is claimed is:

1. A delay circuit for delaying a signal, said delay circuit comprising:

at least one inverter having a time delay;

at least one current source coupled to said at least one inverter, said at least one current source providing charging current to said at least one inverter; and a voltage biasing circuit coupled to said at least one current source, said voltage biasing circuit providing a biasing voltage to said at least one current source such that said at least one current source varies the charging current so as to maintain the time delay of said at least one inverter substantially constant.

2. The delay circuit of claim 1, wherein said at least one inverter comprises a complementary metal oxide semiconductor (CMOS) inverter.

3. The delay circuit of claim 2, wherein said at least one current source comprises a transistor.

4. The delay circuit of claim 3 comprising:

a first CMOS inverter having an input port and an output port;

a first p-channel transistor coupled to said first CMOS inverter and a drive voltage supply; and a first n-channel transistor coupled to said first CMOS inverter and ground potential.

5. The delay circuit of claim 4 further comprising:

a second CMOS inverter having a second CMOS inverter input port and a second CMOS inverter output port, wherein the first CMOS inverter output port is coupled to the second CMOS inverter input port;

a second p-channel transistor coupled to said second CMOS inverter and the drive voltage supply; and a second n-channel transistor coupled to said second CMOS inverter and ground potential.

6. The delay circuit of claim 5, wherein said biasing circuit comprises a resistor having a resistance that is temperature dependent.

7. The delay circuit of claim 6, wherein said biasing circuit further comprises a current mirror coupled to said resistor.

8. A delay circuit for delaying a signal, said delay circuit comprising:

means for causing a delay; and means for biasing said means for causing, said means for biasing coupled to said means for causing and supplying a biasing voltage to said means for causing, said means for biasing supplying a biasing voltage to said means for causing such that delay of said means for causing is substantially constant.

9. An integrated circuit (IC) device comprising:

a register; and a delay circuit coupled to said register, said delay circuit comprising:

at least one inverter having a time delay;

at least one current source coupled to said at least one inverter, said at least one current source providing charging current to said at least one inverter; and a voltage biasing circuit coupled to said at least one current source, said voltage biasing circuit providing a biasing voltage to said at least one current source such that said at least one current source varies the charging current so as to maintain the time delay of said at least one inverter substantially constant.

10. The IC device of claim 9, wherein said at least one inverter comprises a complementary metal oxide semiconductor (CMOS) inverter.

11. The IC device of claim 10, wherein said at least one current source comprises a transistor.

12. The IC device of claim 11 comprising:

a first CMOS inverter having an input port and an output port;

a first p-channel transistor coupled to said first CMOS inverter and a drive voltage supply; and a first n-channel transistor coupled to said first CMOS inverter and ground potential.

13. The IC device of claim 12 further comprising:

a second CMOS inverter having a second CMOS inverter input port and a second CMOS inverter output port, wherein the first CMOS inverter output port is coupled to the second CMOS inverter input port;

a second p-channel transistor coupled to said second CMOS inverter and the drive voltage supply; and a second n-channel transistor coupled to said second CMOS inverter and ground potential.

14. The IC device of claim 13, wherein said biasing circuit comprises a resistor having a resistance that is temperature dependent.

15. The IC device of claim 14, wherein said biasing circuit further comprises a current mirror coupled to said resistor.

16. A method of delaying a signal, said method comprising:

providing a charging current from at least one current source to at least one inverter having a time delay; and providing a biasing voltage to the at least one current source; and varying the biasing voltage to vary the charging current so as to maintain the time delay substantially constant.

17. The method of claim 16, wherein said varying comprises varying the biasing voltage in response to a temperature variation.

18. The method of claim 16, wherein said providing a charging current comprises providing a charging current from at least one biasing transistor having a gate to the at least one inverter and wherein said providing a biasing voltage comprises providing a biasing voltage to the gate of the at least one biasing transistor.

19. A delay circuit for delaying a signal, said delay circuit comprising:

at least one inverter having a time delay, wherein the time delay is susceptible to change due to a temperature effect;

at least one current source coupled to said at least one inverter, said at least one current source providing charging current to said at least one inverter; and a voltage biasing circuit coupled to said at least one current source, said voltage biasing circuit providing a biasing voltage to said at least one current source such that said at least one current source varies the charging current so as to substantially eliminate variations in the time delay due to the temperature effect.

20. The delay circuit of claim 19, wherein said at least one inverter comprises a complementary metal oxide seductor (CMOS) inverter.

21. The delay circuit of claim 20, wherein said at least one current source comprises a transistor.

22. The delay circuit of claim 21 comprising:

a first CMOS inverter having an input port and an output port;

a first p-channel transistor coupled to said first CMOS inverter and a drive voltage supply; and a first n-channel transistor coupled to said first CMOS inverter and ground potential.

23. The delay circuit of claim 22 further comprising:

a second CMOS inverter having a second CMOS inverter input port and a second CMOS inverter output port, wherein the first CMOS inverter output port is coupled to the second CMOS inverter input port;

a second p-channel transistor coupled to said second CMOS inverter and the drive voltage supply; and a second n-channel transistor coupled to said second CMOS inverter and ground potential.

24. The delay circuit of claim 23, wherein said biasing circuit comprises a resistor having a resistance that is temperature dependent.

25. The delay circuit of claim 24, wherein said biasing circuit further comprises a current mirror coupled to said resistor.

26. The delay circuit of claim 1, wherein the time delay of said at least one inverter is subject to a temperature effect and a biasing effect, further wherein the biasing effect substantially cancels the temperature effect on the time delay such that the time delay remains substantially constant as the temperature is varied.

27. The delay circuit of claim 6, wherein the resistance of said resistor varies at a rate of approximately 0.005R per degree centigrade change in temperature.

28. The IC device of claim 9, wherein the time delay of said at least one inverter is subject to a temperature effect and a biasing effect, further wherein the biasing effect substantially cancels the temperature effect on the time delay such that the time delay remains substantially constant as the temperature is varied.

29. The IC device of claim 14, wherein the resistance of said resistor varies at a rate of approximately 0.005R per degree centigrade change in temperature.

30. The method of claim 16, wherein the time delay of the at least one inverter is subject to a temperature effect and a biasing effect, further wherein the biasing effect substantially cancels the temperature effect on the time delay such that the time delay remains substantially constant as the temperature is varied.

31. The delay circuit of claim 24, wherein the resistance of said resistor varies at a rate of approximately 0.005R per degree centigrade change in temperature.

* * * * *